United States Patent [19]

Ginetti

[11] Patent Number: 5,396,435
[45] Date of Patent: Mar. 7, 1995

[54] AUTOMATED CIRCUIT DESIGN SYSTEM AND METHOD FOR REDUCING CRITICAL PATH DELAY TIMES

[75] Inventor: Arnold Ginetti, Antibes, France

[73] Assignee: VLSI Technology, Inc., San Jose, Calif.

[21] Appl. No.: 16,113

[22] Filed: Feb. 10, 1993

[51] Int. Cl.⁶ .......................................... G06F 15/60
[52] U.S. Cl. .................................... 364/489; 364/488
[58] Field of Search ............... 364/488, 489, 490, 578; 395/500

[56] References Cited

U.S. PATENT DOCUMENTS

| | | | |
|---|---|---|---|
| 4,882,690 | 11/1989 | Shinsha et al. | 364/490 |
| 4,924,430 | 5/1990 | Zasio et al. | 364/578 |
| 5,003,487 | 3/1991 | Drumm et al. | 364/489 |
| 5,029,102 | 7/1991 | Drumm et al. | 364/489 |
| 5,191,541 | 3/1993 | Landman et al. | 364/489 |
| 5,197,015 | 3/1993 | Hartoog et al. | 364/490 |
| 5,210,700 | 5/1993 | Tom | 364/489 |
| 5,218,551 | 6/1993 | Agrawal et al. | 364/491 |
| 5,287,289 | 2/1994 | Kageyama | 364/489 |

OTHER PUBLICATIONS

"Optimal Code Generation for Expression Trees"; A. V. Aho and S. C. Johnson; Journal of the Association for Computing Machinery; vol. 23, No. 3, Jul. 1976; pp. 488–501.
"Algorithms For Multi-Level Logic Synthesis and Optimization"; R. K. Brayton et al.; Nato Advanced Study Institute on Logic Synthesis and Silicon Compilation; L'Aquila, Italy, Jul., 1986; pp. 197–248.
"SOCRATES: A System For Automatically Synthesizing and Optimizing Combinational Logic"; David Gregory et al.; 23rd Design Automation Conference; Jun. 1986; pp. 79–85.
"Technology Mapping in MIS"; Ewald Detjeus et al.; ICCAD, Nov. 1987, pp. 116–119.
"Logic Decomposition Algorithms for the Timing Optimization of Multi-Level Logic"; P. Paulin et al.; ICCD 1989; pp. 1–16.
"A Heuristic Algorithm for the Fanout Problem"; K. Singh et al.; 27th ACM/IEEE Design Automation Conference; 1990; pp. 357–360.
"Multilevel Synthesis Minimizing The Routing Factor"; P. Abouzeid et al. 27th ACM/IEEE Design Automation Conference; pp. 365–368.
"Timing Optimization on Mapped Circuits"; Ko Yoshikawa et al.; 28th ACM/IEEE Design Automation Conference; 1991; pp. 112–117.
"DAGON: Technology Binding and Local Optimization"; K. Keutzer; 24th ACM/IEEE Design Automation Conference; 1987; pp. 341–347.

Primary Examiner—Vincent N. Trans
Attorney, Agent, or Firm—Flehr, Hohbach, Test, Albritton & Herbert

[57] ABSTRACT

A computer aided design system automatically modifies a specified circuit netlist to reduce signal delays on critical signal paths. A critical signal path that does not meet specified timing constraints is identified by computing signal slack values for each node, where negative slack values indicate a failure to meeting timing requirements. Critical gates along the critical signal path that are candidates for duplication are identified by determining which critical gates have a fanout greater than one and can be represented by library cells compatible with the next circuit tree along the critical signal path. One such gate is selected and duplicated, with one copy of the duplicated output gate being used to generate only the signal on the critical signal path and the other copy of the duplicated output gate being used to drive all other fanouts of the selected gate. This generates a modified circuit netlist. Then slack values for the modified circuit netlist are compared with those of the previous version of the circuit netlist. If the slack values of circuit on the critical path have been improved, the modified circuit netlist is adopted as the current circuit netlist. If any node in the adopted circuit netlist has a negative slack value, the circuit netlist modification procedure is repeated until either no node has a negative slack, or the process is unable to further improve the slack values of the circuit netlist.

6 Claims, 5 Drawing Sheets

AUTOMATED CIRCUIT DESIGN SYSTEM AND METHOD FOR REDUCING CRITICAL PATH DELAY TIMES

The present invention relates generally to computer aided design systems which facilitate the design of integrated circuits and particularly to computer aided design methods and systems for automatically modifying logic circuit designs to reduce the critical signal path delay times.

BACKGROUND OF THE INVENTION

Virtually all complex integrated circuits are designed with the use of computer aided design (CAD) tools. Some CAD tools, called simulators, help the circuit designer verify the operation of a proposed circuit. Another type of CAD tool, called a silicon compiler (also sometimes known as automatic layout or place and route systems), generates the semiconductor mask patterns from a detailed circuit specification. Other CAD tools modify an existing circuit specification to optimize it for speed, layout area, or both.

Netlists

The detailed circuit specification used by silicon compilers, circuit simulators and other circuit design optimization tools is often called a netlist, and comprises a list of circuit components and the interconnections between those components. Circuit components are also known as "cells" where each cell in a specific circuit library has both a logical representation, as well as a circuit layout representation. A short netlist for a simple circuit is shown in Table 1.

TABLE 1

| | Exemplary Netlist | | | |
|---|---|---|---|---|
| Cell | Input Signals | | Output Signals | |
| Name | 1 | 2 | 1 | 2 |
| XOR | A | B | C | |
| XOR | C | CN1 | Y | |
| AND | A | B | CA | |
| AND | C | CN1 | CB | |
| NOR | CB | CA | CN | |

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably.

In the exemplary netlist shown in Table 1, signals A, B and CN1 are input nodes to the entire circuit, Y and CN are output nodes for the entire circuit, and nodes C, CA and CB are internal nodes.

In addition, the netlist specifies the nature of its components by specifying a cell name for each component. The cell name, in turn, specifies or points to a particular circuit in a predefined library of cells.

Circuits can also be represented by a list of statements in a Hardware Description Language (HDL), such as Verilog or VHDL. The HDL circuit description is then converted into a specific circuit netlist either by an engineer or by an HDL circuit synthesizer using a specified set of library cells.

Timing Constraints and Critical Paths

The problem that the present invention solves is as follows. An integrated circuit may have specified timing constraints, which define the maximum allowable amount of time that between receipt of a particular set of input signals and the generation of output signals on specified output nodes of the circuit. It is possible to determine from the circuit's netlist, and information in the cell library, whether or not the specified circuit will meet the specified timing constraints. In the prior art, if the circuit represented by a specified netlist does not meet the specified timing constraints, a circuit design engineer would have to analyze the circuit and attempt to modify either the circuit's netlist or the circuit's functional specification so that the modified circuit meets the specified timing constraints.

The present invention provides an automated methodology for modifying a circuit netlist so as to decrease the signal delays in critical timing paths of the circuit without changing the logical functions performed by the circuit. In many cases where the specified netlist fails to meet specified timing constraints by a small margin, the present invention will solve the timing problem without requiring an engineer to study and modify the circuit netlist.

Each gate or cell in a cell library is typically characterized by its area, function and timing. The area information in the cell library is used to estimate the total amount of silicon surface area that a specified circuit will occupy (i.e., by summing the individual cell areas and then adding space estimates for space occupied by cell interconnections).

The function information in the cell library is typically specified in terms of a boolean equation, as well as a specification of the number of input signals, output signals, power connections, and so on.

Computing Slack Values for Each Circuit Node.

The timing information in the cell library for a particular cell represents the timing delay from each input put to each output pin. A timing path between an input port I and an output port j of a particular gate is approximated by a minimum gate propagation delay value $P_{ij}$ and a load dependent delay value $R_{ij}$ known as the ramp value. Each input port and each output port is also labeled by its capacitance C. The delay through a gate G from input port i to output port j is thus computed as follows:

$$D_{ij} = P_{ij} + R_{ij} * \left( \sum_{x=1}^{n} C_x + C_r + n*C_c \right)$$

where $C_x$ is the input capacitance of the $x^{th}$ gate driven by gate G, $C_r$ is a user specified routing capacitance representing an estimated capacitance of the gate's output node, $C_c$ is a user specified connection capacitance, and n is the number of input pods of other gates to which the gate output is connected.

In the preferred embodiment, the cell library provides two versions of each component: one with a single output drive and one with a double drive that is able to drive twice as many gates as the single drive cell.

The arrival time A of a generated signal at a node J of a circuit is computed as follows:

$$A(J) = \text{MAX}_{y \in i(J)}(A(y) + (D(y,J))$$

where i(J) is the set of inputs to the cell or gate that generates the signal on node J and D(j,J) is the delay from input node y to node J. This computation starts at the input nodes and progresses toward the specified node J. Thus the computed arrival time for any specified node J is the worst case signal arrival time based on both a specified set of input signal times and the longest signal paths from the input nodes to node J.

The required time R at the same node J (i.e., the latest time at which the generated signal can arrive and meeting the specified timing requirements) is computed as follows:

$$R(J) = MAX_{z \in o(J)}(R(z) + (D(z,J))$$

where o(J) is the set of nodes driven by a cell to which the signal on node J is an input. Thus required times are computed by working from the circuit's output nodes back toward the input nodes, and each node's required time is the earliest time required in order for the signal on the next successive node toward the output of the circuit to meet its timing requirements. The arrival times of signals at the circuit's inputs as well as the required times at the circuit's outputs are specified by the circuit designer. The required signal times and signal arrival times for the circuit's internal nodes are typically computed using the above equations.

The slack S(J) at each node J of the circuit is defined as the difference between the required time and the arrival time for that node:

$$S(J) = R(J) - A(J)$$

Thus, if the slack S(J) for a node is positive in value, the timing requirements of that node are satisfied. However, if the slack S(J) of a node is negative, that means that the circuit has a timing problem.

It is the goal of the present invention to identify circuit nodes having negative slack and to automatically modify the circuit netlist so that all circuit nodes have a non-negative slack value (i.e., greater than or equal to zero).

SUMMARY OF THE INVENTION

In summary, the present invention is a computer aided design system and method for automatically modifying a specified circuit netlist to reduce signal delays on critical paths of the circuit represented by the netlist. The specified circuit netlist is analyzed to determine if it meets specified timing requirements by computing a slack value for each node of the circuit, where the slack value represents the difference between the required arrival time of a signal at each circuit node and the computed worst case signal arrival time for the node. The output node having the most negative slack value is identified as the critical output node. The critical signal path of the circuit is identified as the sequence of critical gates and critical nodes culminating in the gate that drives the critical output node, where each critical gate drives a node in the critical signal path and each node in the critical signal path is the input to a critical gate having the most negative slack value.

The specified circuit netlist is "tiled" so as to map each specified logic gate into one or more circuit cells and also to divide the mapped circuit into circuit trees. Each circuit tree generates an output signal having a fanout greater than one. Then, working from the critical output node back along the critical path, the present invention looks at each circuit tree to determine if it meets certain specified compatibility requirements. If the compatibility requirement is met by a circuit tree, the output gate of the tree is duplicated, with one copy of the duplicated output gate being used to generate only the signal on the critical signal path and the other copy of the duplicated output gate is used to drive all other gates connected to the former output node of the circuit tree. This generates a modified circuit netlist.

Then the slack values of the modified circuit netlist are compared with those of the previous version of the circuit netlist. If the slack times of circuit on the critical path have been improved, the modified circuit netlist is adopted as the current circuit netlist. If any node in the adopted circuit netlist has a negative slack value, the circuit netlist modification procedure is repeated until either no node has a negative slack value, or the process is unable to further improve the slack values of the circuit netlist.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
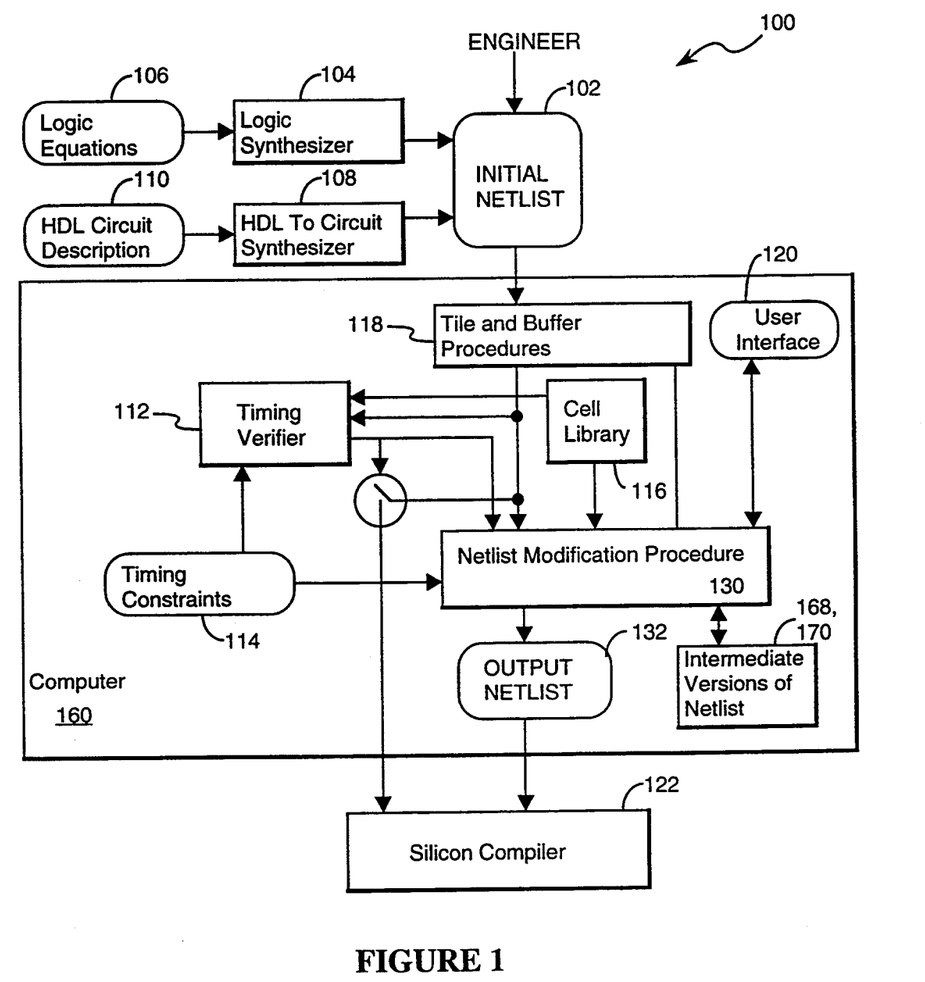
FIG. 1 is a conceptual block diagram of a computer aided circuit design system in accordance with the present invention.
Figure 2:
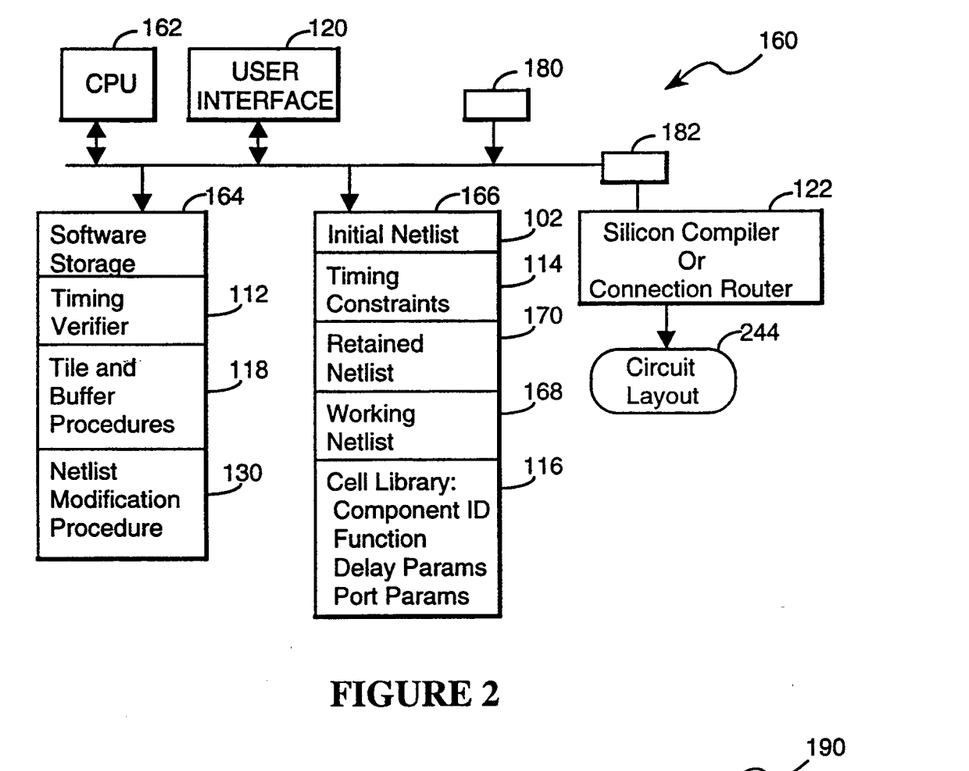
FIG. 2 is a block diagram of a computer system incorporating the present invention.

Referring to FIGS. 1 and 2, the computer aided circuit design (CAD) system 100 of the present invention receives an initial circuit netlist 102 from any of a number of sources. For instance, the initial circuit netlist 102 may be directly generated and input by an engineer, or it may be generated by a logic synthesizer 104 from a set of logic equations 106 prepared by an engineer, or it may be generated by an HDL circuit synthesizer 108 from an HDL circuit description 110 written by an engineer.

The engineer will also generally specify a set of timing constraints 114 for the circuit as well as a cell library 116 for implementing the specified circuit with a particular set of circuit cells. The timing constraints 114 are typically specified by the engineer as a set of input signal timing values and a set of output signal timing values. The delay parameters of each cell in the circuit netlist are obtained from the specified cell library 116, as discussed above.

Figure 3A:
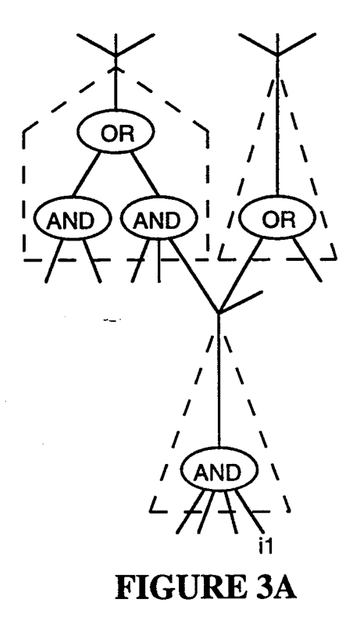
FIGS. 3A, 3B, and 3C represent, respectively, a boolean circuit, the same circuit after it has been "tiled", and the tiled circuit after it has been "buffered".
Figure 3B:
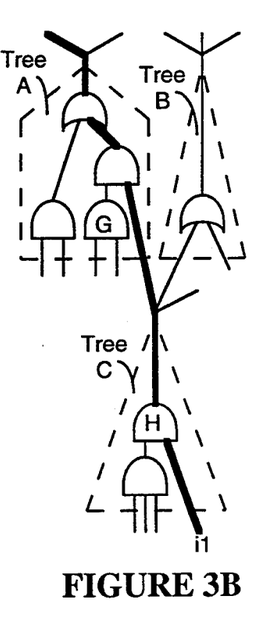
Figure 3C:
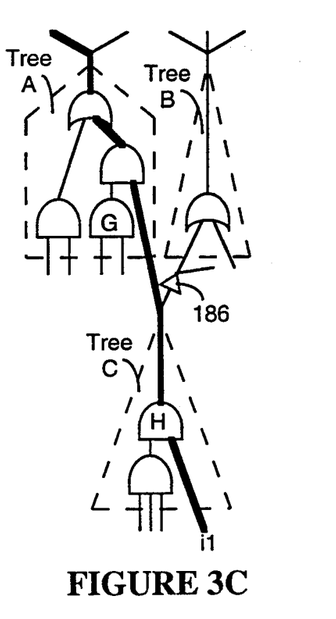

As will be discussed in more detail below, the initial netlist 102 received by the CAD system 100 is first "tiled", which maps the specific logic circuit into particular gates (i.e., cells from a specified cell library) and also divides the circuit into circuit trees (as represented by FIGS. 3A and 3B) and then "buffered" (as represented by FIG. 3C) so as to take care of any signal inversions needed between the output of each circuit tree and the inputs of the following circuit tree. Such tiling and buffering procedures 118 are known to those skilled in the art.

The modified version of the initial netlist 102 produced by the tiling and buffering procedure 118 is analyzed by a timing verification program 112 to determine the slack values for the circuit's nodes using the procedures described above. Using the timing constraints 114 specified by the engineer, the timing verification program 112 computes the required signal times for each node of the specified circuit. Using the delay parameters from the specified cell library, the timing verification program 112 also computes the arrival time of signals at each circuit node, and then computes slack values for each node of the specified circuit.

If the circuit represented by the initial netlist 102 meets all timing requirements, the CAD system generates an appropriate report via the user interface 120. Optionally, the specified initial netlist can be passed to a silicon compiler 122 (or a connection routing program) to generate semiconductor mask patterns corresponding to the netlist 102.

If any of the circuit's timing constraints are not met, the netlist modification procedure 130 of the present invention is then invoked to attempt to modify the specified circuit netlist so as to meet all timing requirements. If successful, the resulting output netlist 132 is then passed back to the user via the user interface 120 and/or to the silicon compiler or connection routing program 122.

As shown in FIG. 2, the preferred embodiment is implemented on a computer workstation 160 having a CPU 162, a user interface 120, disk or other memory storage 164 for storing software modules 112, 118, 130 and the cell library 116. Random access memory 166 is used to store arrays of data such as the initial netlist 102, timing constraints 114, as well as intermediate versions of the circuit netlist herein labeled the working netlist 168 and retained netlist 170. Data such as the initial netlist, timing constraints and the like may be entered either through an input port 180 or through the user interface 120. When the revised netlist has been determined, it can be transmitted via port 182 to a silicon compiler or connection routing program 122. The silicon compiler generates a circuit layout 184 corresponding to the retained netlist 170 output by the netlist modification procedure 130. The silicon compiler 122 may be any one of many commercially available systems including the VLSI Chip Compiler, Version 8, Release 1 by VLSI Technology, Inc., San Jose, Calif.

Tiling and Buffering

The initial netlist 102 is typically a netlist of interconnected boolean gates. In order to determine the timing characteristics of the corresponding circuit, a specific implementation of those boolean gates must be selected, and that selection is represented by the selection of a cell library. The tiling process is sometimes called "technology mapping" in that the logical circuit is mapped into a specific circuit using a selected "technology", such as "1 micron CMOS" or "fast BiCMOS" or the like as represented by a cell library of circuit cells designed using the selected technology. The technology mapping process usually selects the cells to implement specified logical functions so as to minimize a specified cost function, which is typically combines considerations of speed and circuit layout area. As a result of the cost function method of selecting library cells to implement logical functions, individual logic functions may sometimes be mapped into a plurality of cells, while other logic functions are each mapped into a single library cell.

In addition, the tiling process also organizes the technology mapped cell netlist into "trees", where the root (output) node of each tree has a fanout greater than one, and the internal nodes of each tree has a fanout of just one. Thus, every gate that has a fanout greater than one is defined as the root node of another tree. FIGS. 3A, 3B and 3C identify each tree in an exemplary circuit with a dotted outline. The gate driving the root node of each tree in the initial netlist is a potential candidate for duplication in the netlist modification procedure of the present invention.

The tiling procedure used in conjunction with the present invention may be any one of many commercially available technology mapping systems including the VLSI Logic Synthesizer, Version 8, Release 1 by VLSI Technology, Inc., San Jose, Calif. Tiling procedures are also explained in U.S. patent application Ser. No. 07/862,100, filed Apr. 2, 1992.

The task of buffering synthesis is to add buffers and inverters at the outputs of each tree as required to connect the output of the tree to the inputs of the following tree in accordance with the circuit netlist. Buffering allows each tree to be implemented with a subnetlist that is independent of the signal polarities needed by the inputs to the following trees, and also helps the circuit meet timing requirements by adding buffers and inverters that enhance the drive of the output gate of tree, although the delay associated with such buffers and inverters needs to be taken into account. Such buffer synthesis techniques are known to those skilled in the art, and are discussed in U.S. patent application Ser. No. 07/862,895, filed Apr. 2, 1992.

For the purposes of the present invention, the aspect of the tiling and buffering procedures that are relevant is that the only gates of the specified netlist that candidates for duplication are output gates of circuit trees (i.e., only gates having a fanout greater than one) whose output signal polarity matches that of the critical input port of the next tree driven by that gate.

FIG. 3A shows a specific logic circuit, FIG. 3B shows the same circuit after it has been tiled (i.e., implemented using the logic circuit cells of a particular cell library), and FIG. 3C shows the same circuit after it has been buffered (e.g., see buffer 186). The bold lines in FIGS. 3B and 3C represent the critical signal path, as will be discussed below. As can be seen by comparing FIGS. 3A and 3B, a logic function such as "AND" may be implemented by the tiling process using more than one logic gate. The cell library will typically have a number of cells that implement each logic function, each such cell having a specified number of input signals, cell area, drive capability and so on. The tiling process implements each specified logical function with the one cell or set of cells that minimizes a predefined cost function. For instance, the cost function may disfavor logic gates having more than two input signals, because such gates are slower than two-input gates.

Referring to FIG. 3C, the buffering process will typically add buffers to nodes having a fanout greater than some specified value, such as two, in order to supplement the drive strength of a tree's output gate. Inverting buffers are also added whenever the polarity of a tree's output does not match the polarity of a corresponding input in the next tree.

Netlist Modification Process

Figure 4A:
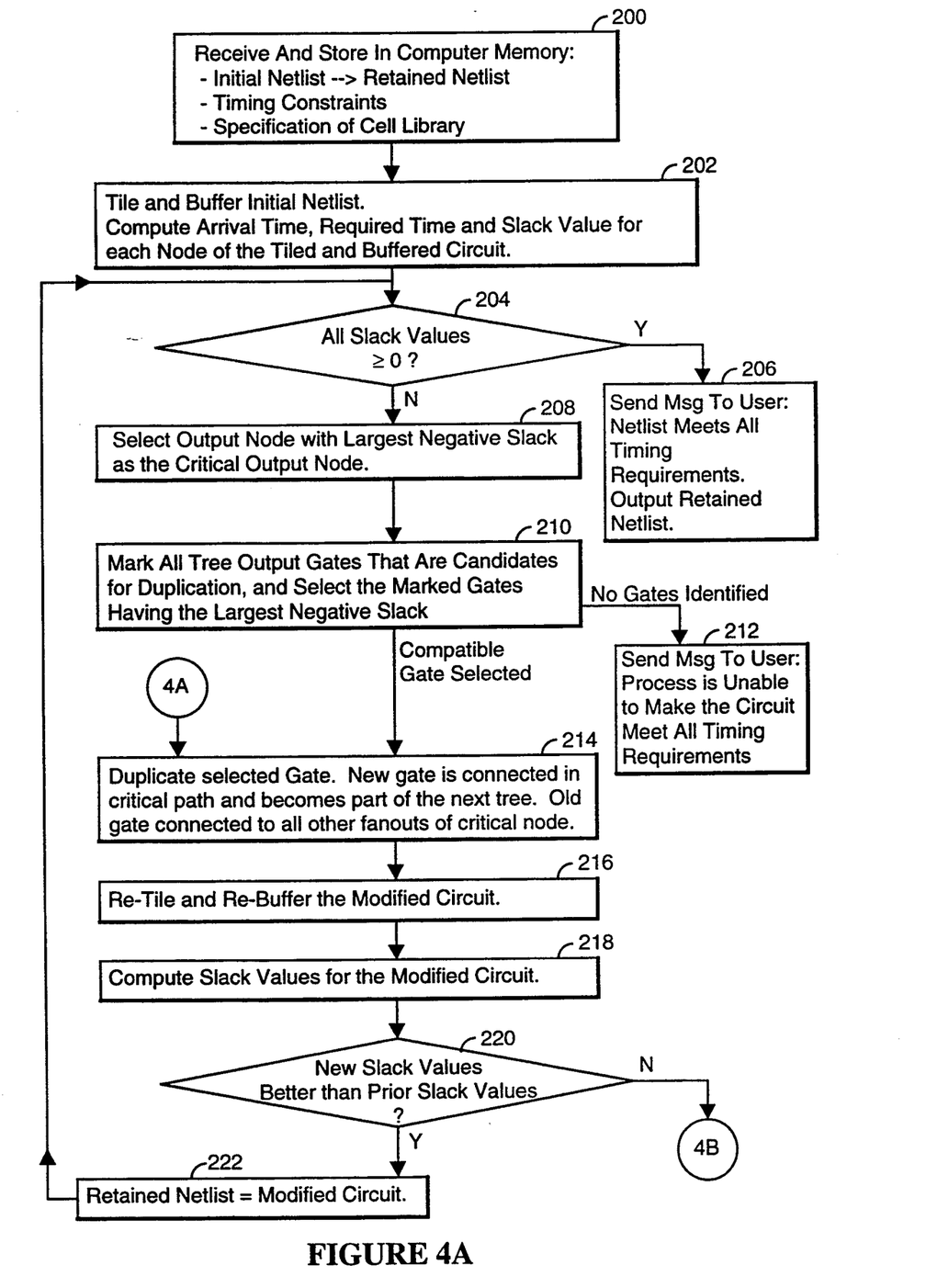
FIGS. 4A and 4B depict a flow chart representing a preferred embodiment of the present invention.
Figure 4B:
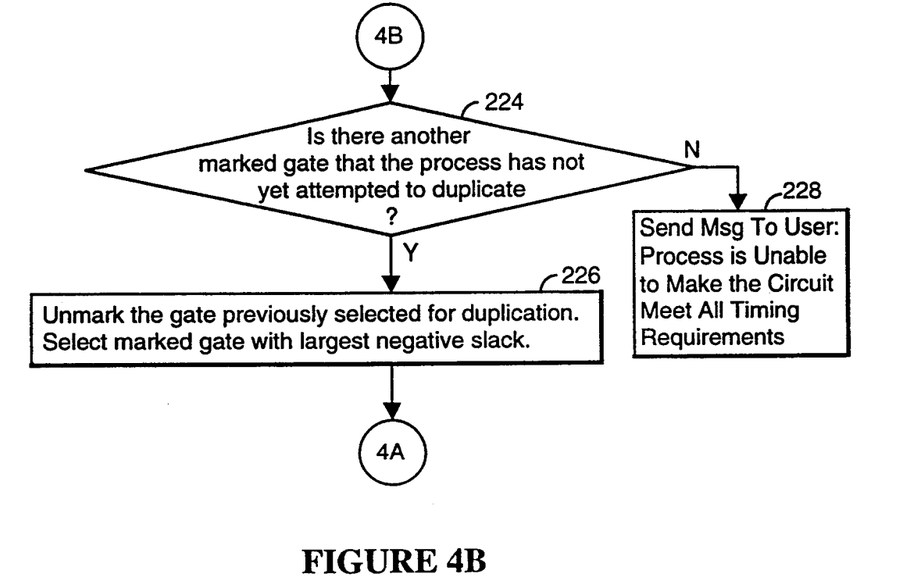

Referring to the flow chart in FIGS. 4A and 4B and the pseudocode representation of the netlist modification procedure in Table 2, the initial steps of the netlist modification process are the one's discussed above: receiving the initial netlist and the specified timing constraints and the specification of the cell library to use (step 200). The initial netlist is also copied into the "retained netlist" memory array 170, which represents the best version of the netlist at the current point in the netlist modification process. Next, the initial netlist is tiled and buffered, and then slack values for each node of the tiled and buffered circuit are computed (step 202) and tested (step 204) to determine if the initial netlist meets the specified timing constraints.

If all the circuit nodes in the initial netlist have non-negative slack values, the netlist does not need to be modified to meeting the specified timing requirements, and thus the netlist modification process immediately exits with a message to the user indicating that the circuit meets all timing constraints (step 206). Otherwise, the output node N1 with the greatest negative slack is selected as the critical output node (208).

Note that the "critical input node" of a gate is the input node having the largest negative slack value. A "critical gate" is defined as a gate driving a critical node. The "critical path" is defined herein to be the set of critical input nodes of critical gates plus the critical output node.

Starting at the output node with the worst slack, the netlist modification process traces backwards along the critical path and mark as candidates for duplication all gates that meet the following criteria (step 210):

(A) the gate's output on the critical path has a fanout greater than one, (i.e., it is the output of a tree generated by the circuit tiling process).

(B) the gate's output, or another gate in the cell library that performs the same logical function and has a delay time (from the critical input node to the gate's output) not greater than the current gate in the netlist when that gate has a fanout of one, has the same polarity as is required for the next gate input along the critical path (i.e., no buffering will be needed along this part of the critical path after the gate is duplicated), and (C) the node driven by the gate's output has negative slack.

Figure 5:
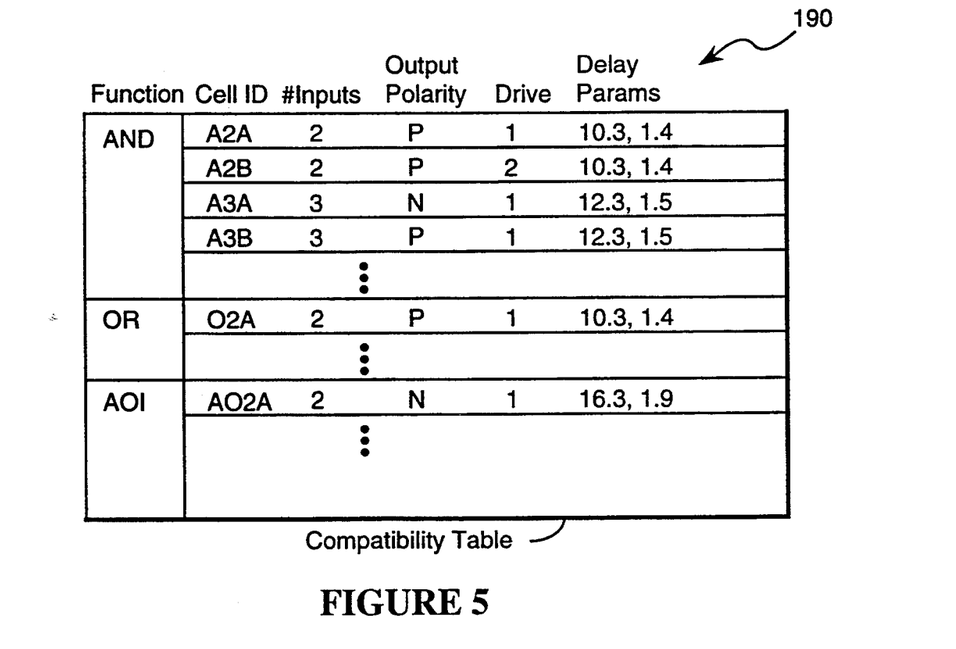
FIG. 5 is a conceptual representation of a compatibility table used in the preferred embodiment of the present invention.

Note that the process of selecting candidate gates requires inspection of the cell library for gates that meet the above compatibility requirements. Referring to FIG. 5, in the preferred embodiment the cell library 116 includes a compatibility table 190 (or the netlist modification procedure will build one) that lists the logical function performed by each cell, the number of input signals for the cell, and the polarity of its output. Other parameters such as delay parameters, area values and so on may be included in the compatibility table or listed in another portion of the cell library.

If no candidate gates are marked by the above selection process, the automated netlist modification process cannot solve the circuit's timing problem and exits with a message indicating that the process is unable to improve the critical path length, and lists the best computed netlist.

If any candidate gates were marked, the marked gate that drives the node having the greatest negative slack is selected (step 210). This will typically be the marked gate closest to the circuit's output, but that is not always the case. If no candidate gates were marked, this means that none of the critical gates in the critical path meet the above listed criteria for logic duplication. In that case, an appropriate process failure message is sent to the user (step 212).

Normally, several of the gates in the critical net will be candidates for duplication, and one gate will be selected by step 210. Then a modified netlist is generated by duplicating the selected gate (step 214). Referring to the exemplary circuit in FIGS. 3B and 6A, gate H in the circuit of FIG. 3B is duplicated, producing a second gate H*. Note that the new copy of the selected gate may actually be a different cell in the cell library than the selected gate, since the new gate selected from the library will generally be the fastest available cell that meets the gate's functional requirements. Thus the term "duplication" in the context of the present invention is defined to mean that the selected gate is divided into two parallel cells.

Figure 6A:
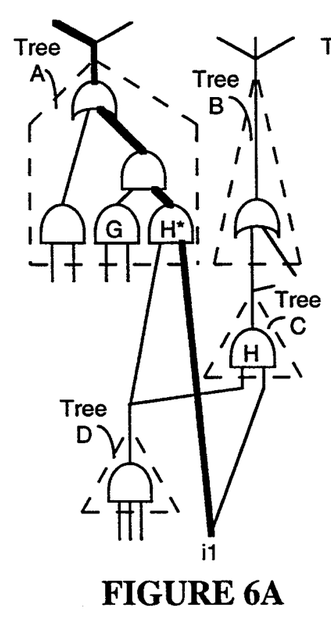
FIGS. 6A, 6B and 6C represent, respectively, a circuit which has been modified in accordance with the present invention to reduce delays in the critical time path, the modified circuit after it has been "re-tiled", and the modified tiled circuit after it has been "re-buffered".
Figure 6B:
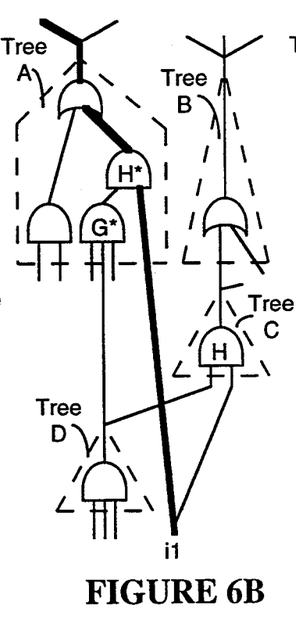
Figure 6C:
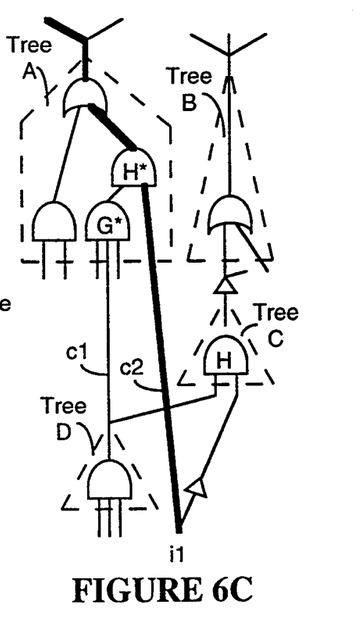

The new copy of the gate is interconnected along the critical path using a fanout of one, meaning that the only input driven the new copy of the gate is the critical input node of the next circuit tree. The old copy of the gate is connected to all other input nodes (fanouts) associated with the gate (step 214). Then the resulting circuit netlist is re-tiled and re-buffered to produce a further modified netlist (step 216). A circuit with a duplicated gate is shown in FIG. 6A, and the results of the re-tiling and re-buffering steps are shown in FIGS. 6B and 6C, respectively. Note that the current "working netlist" is stored in array 168 (FIG. 2) and that this working netlist is dynamically changed by the netlist modification process.

The modified netlist is then tested by computing new slack values for the modified netlist (step 218) and then comparing the slack values of the modified netlist with the slack values for the previous version of the netlist (step 220). If the new slack values are better than the previous slack values (e.g., if the worst slack value of modified "working" netlist is better than the worst slack value of the retained netlist), the modified netlist is stored as the retained netlist (step 222), where the retained netlist is the best netlist generated at the current point in the netlist modification process. Then the netlist modification process resumes at step 204.

If the new slack values are not better than the slack values of the prior retained circuit, then the netlist modification process determines if there is at least one other marked gate in the critical path that the process has not yet attempted to duplicate (step 224). If there is such a marked critical gate, the previously selected gate is unmarked (so that it will not be selected again in the future) and the remaining marked gates are scanned so as to select the one with the largest negative slack value (step 226). Then the netlist modification process resumes at step 214. If no additional marked gates are available, an appropriate process failure message is sent to the user (step 228).

TABLE 2

Psuedocode For Netlist Modification Procedure
to Reduce Critical Path Propagation Times A. Enter Circuit Data To Be Processed:
  Read Circuit Netlist.
  Read Timing Constraints R(x) for all nodes of the circuit.
  Tile and buffer circuit using standard techniques to produce revised netlist.
B. Store current netlist as "best retained netlist".
C. Initial Computations To Identify Critical Paths With Timing Problems:
  Compute delay times for all component input/output node pairs.
  Compute signal arrival times (worst case input node to specified circuit node delay times) for all circuit nodes.
  Compute slack S(x) for each circuit node x, and produce list of nodes with negative slack.
D. If none of the output nodes has a negative slack
  { Exit procedure with message indicating that the circuit meets all timing constraints. }
  Else
  { Identify the output node N1 with the greatest negative slack. }
E. Amending the Netlist:
  Starting at the output node with the worst slack, trace backwards along the critical path and mark as candidates for duplication all gates that meet the following criteria:
    (A) the gate's output on the critical path has a fanout greater than one,
    (B) the gate's output, or another gate in the cell library that performs the same logical function and has a delay time not greater than the current gate in the netlist, has the same polarity as is required for the next gate input along the critical path (i.e., no buffering is or will be needed along this part of this critical path), and
    (C) the node driven by the gate's output has negative slack.
  If no gates were marked,
  { Exit procedure with message indicating that the process is unable to improve the critical path length, and list the best computed netlist.
  }
  Else
  { Select from the marked gates the gate MGi that drives the node Ns1 having the greatest negative slack. }
F. Generate new netlist by:
  Duplicating the selected gate MGi. Interconnect the new copy of the gate along the critical path using a fanout of one, and interconnect the old copy of the gate for all other fanouts.
  Retile and Rebuffer the circuit.
G. Test new netlist:
  Compute Slack values for revised netlist.
  Compare with previous slack values for circuit.
  If new slack values are better than previous slack values (if the worst slack value of new netlist is better than the worst slack value of retained netlist),
  { Store new netlist as retained netlist.
    Resume or restart process at step D. }
  Else
  { If there is at least one marked gate MGj in the critical path which the process has not yet attempted to duplicate,
    { Unmark gate MGi.
      Select the gate MGj with the largest negative slack and make that the selected gate MGi.
      Resume process at step F. }
    Else
    { Exit procedure with message indicating that the process is unable to modify netlist so as to meet all timing constraints, and list the best computed netlist.
    }
  }
End of Netlist Modification Procedure The above describe netlist modification process continues until either all slack values are non-negative, or the process is unable to find any critical gates suitable for duplication. In either case, the best modified netlist generated by the process is output for inspection by the user and/or for input to a silicon compiler or interconnection routing program 122.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of synthesizing an integrated circuit, the steps of the method comprising:
  (A) receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;

(B) receiving and storing in a computer memory a plurality of timing constraints, said timing constraints representing maximum delay times for signals to propagate from input nodes to output nodes of said integrated circuit;

(C) receiving cell delay data representing signal delays associated with said components in said integrated circuit;

(D) computing worst case delay times for said nodes and comparing said worst case delay times with said timing constraints;

(E) when said comparing step results in a determination that at least one timing constraint is not met, modifying said netlist by:

(E1) identifying a critical signal path through said integrated circuit and identifying components along said critical signal path that drive more than one input of other components in said integrated circuit; and (E2) replacing one of said identified components with first and second components, said first component driving only one component input that is on said critical signal path and said second component driving all other component inputs driven by said one identified component; and (F) passing said netlist and capacitance values to a silicon compiler and automatically placing/routing a circuit having said components in said modified netlist.

2. The method of claim 1, including repeating steps (D) and (E) until all of said timing constraints are met prior to performing step (F), wherein successive repetitions of step (D) compute worst case delay times for respective successively modified netlists.

3. The method of claim 2, each repetition of said step (D) further including tiling and buffering said modified netlist prior to computing worst case delay times and comparing said worst case delay times with said timing constraints.

4. A computer aided design system for synthesizing an integrated circuit, comprising:

data input means and storage means for receiving and storing in a computer memory a netlist denoting a list of components in said integrated circuit and a set of nodes interconnecting said components; each said component of said integrated circuit having at least one input port and at least one output port, said set of nodes including a set of circuit input nodes and circuit output nodes for said integrated circuit;

said data input means and storage means also receiving and storing in a computer memory a plurality of timing constraints, said timing constraints representing maximum delay times for signals to propagate from input nodes to output nodes of said integrated circuit;

said data input means and storing further receiving and storing cell delay data representing signal delays associated with said components in said integrated circuit;

signal delay determination means for computing worst case delay times for said nodes and comparing said worst case delay times with said timing constraints;

netlist modification means for modifying said netlist when said signal delay determination means determines that at least one timing constraint is not met, said netlist modification means modifying said netlist by:

identifying a critical signal path through said integrated circuit and identifying components along said critical signal path that drive more than one input of other components in said integrated circuit; and replacing one of said identified components with first and second components, said first component driving only one component input that is on said critical signal path and said second component driving all other component inputs driven by said one identified component; and means for passing said netlist to a silicon compiler for automatically placing/routing a circuit having said components in said modified netlist.

5. The system of claim 4, including control means for repeatedly invoking said signal delay determination means and netlist modification means until all of said timing constraints are met prior to passing said netlist to said silicon compiler.

6. The system of claim 5, wherein said signal delay determination means includes means for tiling and buffering said netlist prior to computing said worst case delay times and comparing said worst case delay times with said timing constraints.

* * * * *